(12) United States Patent
Lee et al.

(10) Patent No.: US 10,429,945 B2
(45) Date of Patent: Oct. 1, 2019

(54) DISPLAY DEVICE AND METHOD FOR DISPLAYING IMAGE

(71) Applicant: SAMSUNG ELECTRONICS CO., LTD., Suwon-si, Gyeonggi-do (KR)

(72) Inventors: Min Jae Lee, Suwon-si (KR); Yool Hee Joh, Gwangmyeong-si (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 127 days.

(21) Appl. No.: 15/657,542

(22) Filed: Jul. 24, 2017

(65) Prior Publication Data
US 2018/0059799 A1 Mar. 1, 2018

(30) Foreign Application Priority Data

Aug. 30, 2016 (KR) ........................ 10-2016-0111122

(51) Int. Cl.
| G06K 9/00 | (2006.01) |
| G06F 3/02 | (2006.01) |
| G06F 3/0488 | (2013.01) |
| G06F 3/01 | (2006.01) |
| G06F 3/0354 | (2013.01) |
| G06F 3/0484 | (2013.01) |
| H01L 27/32 | (2006.01) |

(52) U.S. Cl.
CPC ............ G06F 3/0202 (2013.01); G06F 3/017 (2013.01); G06F 3/0488 (2013.01); *G06F 3/03547* (2013.01); *G06F 3/04845* (2013.01); *H01L 27/3211* (2013.01)

(58) Field of Classification Search
CPC ... G09G 2300/0452; G09G 2340/0457; G09G 3/3607; G09G 2340/0407; G09G 2320/0233
See application file for complete search history.

(56) References Cited

U.S. PATENT DOCUMENTS

| 9,489,928 B2 | 11/2016 | Andrysco et al. |
| 9,544,580 B2 | 1/2017 | Park et al. |
| 9,558,690 B2 | 1/2017 | Lee et al. |
| 2011/0141114 A1* | 6/2011 | Chen ...................... G06F 3/012 |
| | | 345/428 |

(Continued)

OTHER PUBLICATIONS

Search Report dated Oct. 25, 2017 in counterpart International Patent Application No. PCT/KR2017/007902.

*Primary Examiner* — Li Liu
(74) *Attorney, Agent, or Firm* — Nixon & Vanderhye P.C.

(57) ABSTRACT

A display device includes a calculator that calculates a number of horizontal pixels and a number of vertical pixels, a determiner that divides pixels of an image into a plurality of pixel groups, determines at least one pixel among the pixels as a first pixel based on a pixel value of the pixels included in each pixel group, and determines at least one pixel except for the first pixel among the pixels as a second pixel, a first image processor that performs an image-enhancement process on the first pixel among pixels to be included in the image to allow a first substance to correspond to a first substance increase rate, and a second image processor that performs an image-enhancement process on the second pixel among the pixels to be included in the image to allow a second substance to correspond to a second substance increase rate.

20 Claims, 11 Drawing Sheets

(56) References Cited

U.S. PATENT DOCUMENTS

| | | | |
|---|---|---|---|
| 2011/0148930 A1* | 6/2011 | Lee | G06F 3/04897 |
| | | | 345/660 |
| 2011/0279493 A1* | 11/2011 | Phan | G09G 3/20 |
| | | | 345/694 |
| 2014/0118354 A1* | 5/2014 | Pais | G09G 5/373 |
| | | | 345/428 |
| 2014/0118512 A1 | 5/2014 | Park et al. | |
| 2015/0179150 A1 | 6/2015 | Andrysco et al. | |
| 2015/0213786 A1 | 7/2015 | Mamajiwala et al. | |
| 2015/0248210 A1 | 9/2015 | Lee et al. | |
| 2016/0080448 A1 | 3/2016 | Spears et al. | |
| 2017/0025053 A1* | 1/2017 | Broughton | G09G 3/2003 |
| 2018/0095528 A1* | 4/2018 | Tao | |
| 2018/0182359 A1* | 6/2018 | Liu | |

* cited by examiner

DISPLAY DEVICE AND METHOD FOR DISPLAYING IMAGE

CROSS-REFERENCE TO RELATED APPLICATION

This application is based on and claims priority under 35 U.S.C. § 119 to a Korean patent application filed on Aug. 30, 2016 in the Korean Intellectual Property Office and assigned Serial number 10-2016-0111122, the disclosure of which is incorporated by reference herein in its entirety.

TECHNICAL FIELD

The present disclosure relates generally to a display device for displaying an image and a method for displaying the image.

BACKGROUND

A display device includes a display panel, such as a liquid crystal panel, an organic light emitting panel, etc. Resolution is an important factor for the display device and is determined by the number of pixels included in the display panel.

As the technology for the display advances, the resolution of the display panel increases, and the increase of the resolution causes an increase in density of pixels of the display.

The pixel density of the display exerts an influence on a sharpness and an expressiveness of an image displayed through the display. For instance, in a case that the pixel density of the display is high, the sharpness and the expressiveness of the image may be improved. However, in a case that the pixel density of the display exceeds a pixel density recognizable by a viewer, the high pixel density does not result in improvement of the image quality.

SUMMARY

Example aspects of the present disclosure address at least the above-mentioned problems and/or disadvantages and to provide at least the advantages described below. Accordingly, an example aspect of the present disclosure is to provide a display device for improving a quality of an image by performing image enhancement process on the image and a method for improving the quality of the image.

In addition, an example aspect of the present disclosure is to provide a display device including a calculator comprising calculating circuitry configured to calculate a number of horizontal pixels and a number of vertical pixels, which are recognized as one pixel by a viewer, a determiner comprising determining circuitry configured to divide pixels of an image into a plurality of pixel groups, each being defined by the number of horizontal pixels and the number of the vertical pixels, to determine at least one pixel among the pixels included in each pixel group as a first pixel based on a pixel value of the pixels included in each pixel group, and to determine at least one pixel other than the first pixel from among the pixels included in each pixel group as a second pixel, a first image processor configured to perform an image-enhancement process on the first pixel to allow a first substance (image enhancement factor) to correspond to a first substance increase rate, and a second image processor configured to perform an image-enhancement process on the second pixel to allow a second substance (image enhancement factor) to correspond to a second substance increase rate.

In accordance with an example aspect of the present disclosure, a method for displaying an image using at least one processor includes calculating a number of horizontal pixels and a number of vertical pixels, which are recognized as one pixel by a viewer, dividing pixels of the image into a plurality of pixel groups, each pixel group being defined by the number of horizontal pixels and the number of the vertical pixels, determining at least one pixel among the pixels included in each pixel group as a first pixel based on a pixel value of the pixels included in each pixel group and determining at least one pixel other than the first pixel from among the pixels included in each pixel group as a second pixel, and performing in parallel an image-enhancement process on a first substance (image enhancement factor) of the first pixel and an image-enhancement process on a second substance (image enhancement factor) of the second pixel.

BRIEF DESCRIPTION OF THE DRAWINGS

The above and other aspects, features, and attendant advantages of the present disclosure will be more apparent and readily appreciated from the following detailed description, taken in conjunction with the accompanying drawings, in which like reference numerals refer to like elements, and wherein.

Throughout the drawings, it should be noted that like reference numbers are used to depict the same or similar elements, features, and structures.

DETAILED DESCRIPTION

Figure 1:
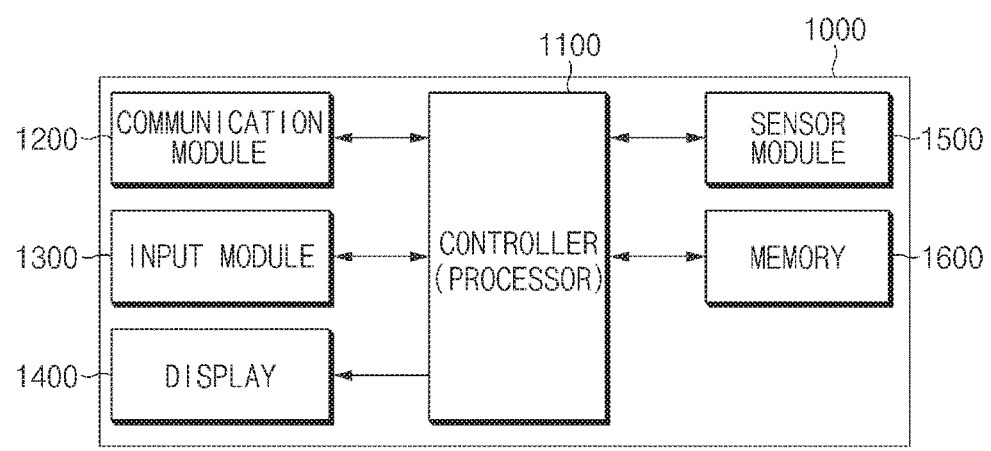
FIG. 1 is a block diagram illustrating an example configuration of a display device according to an example embodiment of the present disclosure.

Hereinafter, various example embodiments of the present disclosure may be described in greater detail with reference to accompanying drawings. Accordingly, those of ordinary skill in the art will recognize that modifications, equivalents, and/or alternatives of the various example embodiments described herein can be made without departing from the scope and spirit of the present disclosure. With regard to description of drawings, similar components may be marked by similar reference numerals.

FIG. 1 is a block diagram illustrating an example configuration of a display device 1000 according to an example embodiment of the present disclosure.

Referring to FIG. 1, the display device 1000 may include a communication module (e.g., including communication circuitry) 1200, an input module (e.g., including input circuitry) 1300, a display 1400, a memory 1600, a sensor module (e.g., including at least one sensor) 1500, and at least one processor (e.g., including processing circuitry) 1100. In the display device 1000 according to various embodiments, some elements may be omitted or other additional elements may be added. Furthermore, some of the elements of the display device 1000 may be combined with each other so as to form one entity, so that the functions of the elements may be performed in the same manner as before the combination.

According to an embodiment, the display device 1000 may be an image device such as a television set, or the like, but is not limited thereto. The display device 1000 may be implemented separately from the image device and perform an image enhancement process on an image to be displayed through a display. For example, the display device 1000 may be an image enhancement device that is arranged between an external device and the image device (e.g., a TV, a monitor, etc.) and performs the image enhancement process on a source image from the external device to provide the enhanced image to the image device. The image device may be connected to the display device by an RGB cable. The display device 1000 may include a plurality of components (e.g., a server, a terminal, etc.).

According to an embodiment, the communication module 1200 may include various communication circuitry, including, without limitation, a wired or wireless interface to receive an image from an external device. The external device may be, for example, a device that transmits an image corresponding to contents received from an external server or stored in an internal (or external) recording medium to the display device 1000. For example, the external device may receive broadcasting contents from a broadcasting server through a broadcasting network or web contents from a web server through an internet network. As another example, the external device may reproduce the contents stored in the internal (or external) recording medium and transmit a content image to the display device 1000. The external device may be implemented by various devices, such as, for example, and without limitation, set-top boxes, game consoles (e.g., Xbox™ and PlayStation™), smartphones, tablet PCs, or the like, to receive or store the contents and to transmit the contents to the display device 1000. The recording medium may include, for example, a compact disc (CD), a digital versatile disc (DVD), a hard disc, a blue-ray disc, a memory card, an USB memory, or the like, but is not limited thereto.

According to an embodiment, the memory 1600 may include an internal memory or an external memory. The memory 1600 may be, for example, a non-volatile memory, such as a flash memory, a hard disc, or the like, or a volatile memory such as an RAM. The memory 1600 may store instructions or data associated with at least one other component of the display device 1000. In an example embodiment, the memory 1600 may store the image received from the external device. In an example embodiment, the memory 1600 may store the data required to perform the image enhancement process on the image. The data may include, for example, at least one of a viewer's eyesight, a resolution of a display, a size of a display, a first adjustment rate, and a second adjustment rate.

According to an embodiment, the sensor module 1500 may include various sensors and/or sensing circuitry including, for example, and without limitation, a distance sensor to sense a viewing distance of the viewer. For instance, the distance sensor may be an infrared sensor provided to the display device 1000 to sense the viewing distance of the viewer based on a light signal (e.g., an infrared ray) reflected from the viewer. As another example, the distance sensor may be implemented by a plurality of cameras that is able to sense the viewing distance based on time difference.

According to an example embodiment, the input module 1300 may include various input circuitry and provide an interface to set at least one of the resolution of the display, the size of the display, the viewer's eyesight, and the distance of the viewer. The input module 1300 may provide an interface to set a brightness, a resolution, and a contrast of the image displayed through the display 1400. The input module 1300 may include, for example, a touch panel and a key. In addition, the touch panel may further include a control circuit. The key may include, for example, a physical button, an optical key, or a key pad. The input module 1300 may include an interface that is able to communicate with a remote control device. For instance, the communication module 1200 may include, for example, at least one of a WiFi module, a Bluetooth module, and a RF module.

The display 1400 may include, for example, a liquid crystal display (LCD), a light emitting diode (LED) display, an organic light emitting diode (OLED) display, or an electronic paper display, or the like, but is not limited thereto. The display 1400 may display, for example, various contents, e.g., a text, an image, a video, an icon, and/or a symbol, to the viewer. The display 1400 may include a plurality of pixels, and each pixel may be implemented by a combination of LEDs that reproduce a color using at least two light sources among three colors of RGB and a light source of LCD in each pixel.

The processor 1100 may include various processing circuitry, such as, for example, and without limitation, at least one of a dedicated processor, a central processing unit (CPU), a graphic processing unit (GPU), a microprocessor, an application processor, an application specific integrated circuit (ASIC), and field programmable gate arrays (FPGA) and include a plurality of cores. The processor 1100 may execute a calculation and/or a data processing related to a control and/or a communication on at least one other component of the display device 1000. For example, the processor 1100 may control each of the communication module 1200, the input module 1300, the display 1400, the memory 1600, and the sensor module 1500 to perform an image enhancement process on each pixel group of the image. Detailed configurations of the processor 1100 will be described in greater detail below with reference to FIG. 2.

Figure 2:
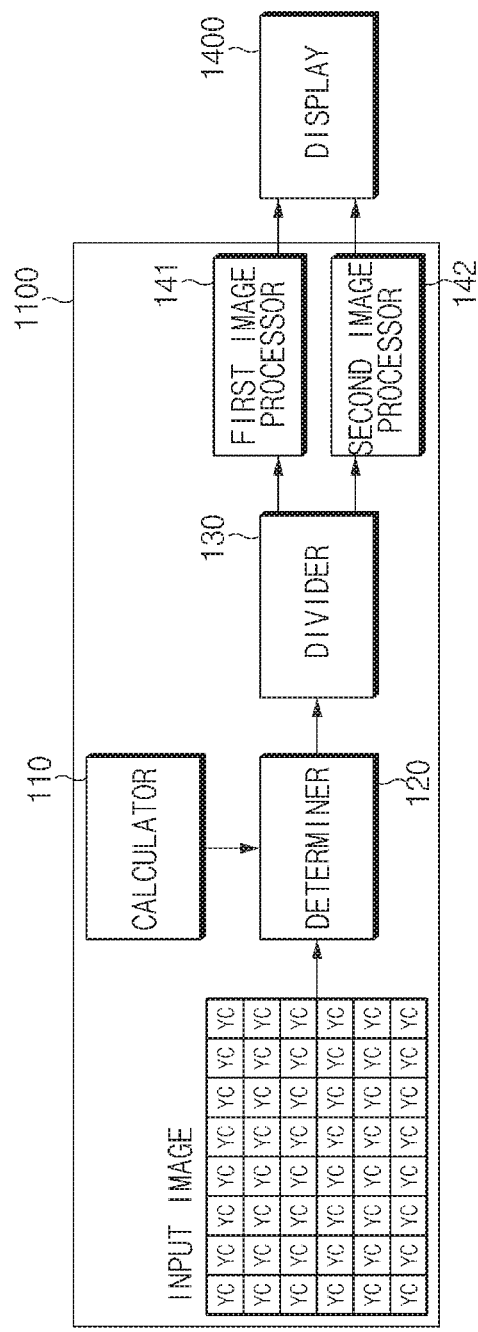
FIG. 2 is a diagram illustrating an example processor according to an example embodiment of the present disclosure.
Figure 3:
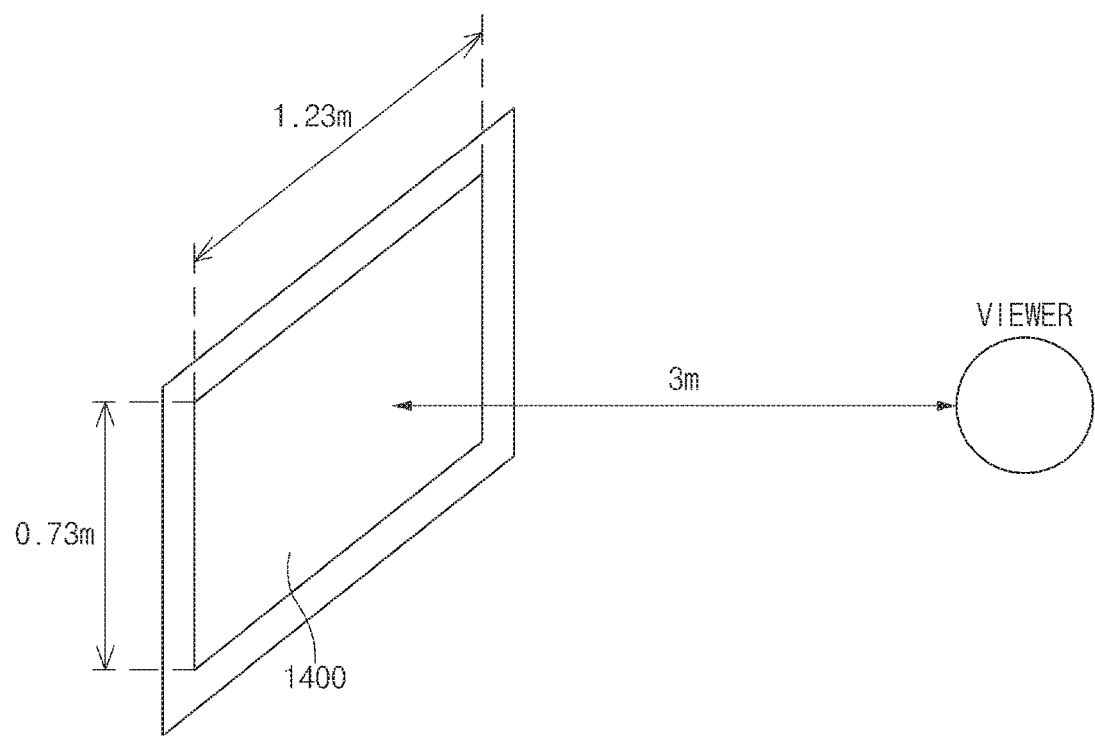
FIG. 3 is a diagram illustrating an example process of calculating a pixel group according to an example embodiment of the present disclosure.

FIG. 2 is a diagram illustrating an example processor according to an embodiment of the present disclosure, and FIG. 3 is a view illustrating a process of calculating a pixel group of a processor according to an embodiment of the present disclosure.

Referring to FIG. 2, the processor 1100 may include a calculator (e.g., including processing circuitry and/or program elements) 110, a determiner (e.g., including processing circuitry and/or program elements) 120, a divider (e.g., including processing circuitry and/or program elements) 130, and/or first and second image processors (e.g., including processing circuitry and/or program elements) 141 and 142. At least one of the calculator 110, the determiner 120, the divider 130, and the first and second image processors 141 and 142 may be omitted. Each component 110, 120,

130, 141, and 142 of the processor 1100 may be a hardware module or a software module or any combination thereof implemented by at least one processor. For instance, functions of modules included in the processor 1100 may be executed by one processor or separate processors, respectively.

According to an example embodiment, the calculator 110 may determine a number of horizontal pixels and a number of vertical pixels, which are included in one pixel group. The pixel group may be a set of pixels recognized as one pixel by the viewer and may include a plurality of pixels. Each pixel group may, for example, have a square shape. Each pixel group may include, for instance, 2×2, 3×3, or 4×4 pixels. Each pixel group may have, for example a rectangular shape closer to the square shape. The rectangular shape may be a quadrangular shape in which a ratio of a long side to a short side is less than two. Each pixel group may include, for instance, 2×1, 3×2, 1×2, or 2×3 pixels.

In an embodiment, the calculator 110 may determine the pixel group using at least one group variable. The at least one group variable may include, for example, and without limitation, at least one of the viewer's eyesight, the viewing distance, the resolution of the display, and the size of the display. The calculator 110 may verify at least one of the viewer's eyesight and the viewing distance provided through the input module 1300. The calculator 110 may sense the distance between the display 1400 and the viewer using the sensor module 1500 to verify the viewing distance of the viewer.

In an example embodiment, the calculator 110 may verify at least one group variable in a designated mode. For instance, the designated mode may be a certain execution state (e.g., after completing booting) of the display device 1000. As another example, the designated mode may be a state in which the viewer executes a predetermined menu (e.g., a pixel group variable input menu).

In an embodiment, the calculator 110 may assign at least one group variable to the following Equation 1 to calculate a maximum number of perceptible pixels.

Discriminant variable of viewer=2×viewing distance×tan($a$/2)

Perceptible resolution=size of display/discriminant variable of viewer

Maximum number of perceptible pixels=resolution of display/perceptible resolution    Equation 1

In Equation 1, the discriminant variable of the viewer may indicate a minimum distance (mm) that is able to be discriminated in the display 1400 at a position of the viewer and by an eyesight of the viewer. The discriminant variable of the viewer may be determined depending on the viewer's eyesight and the viewing distance. The "$a$" may be an eyesight factor in Snellen's chart. The "$a$" is about 1/60 arc degree in a case that the eyesight of the viewer is about 2.0/2.0, and a numerator value may increase as the viewer's eyesight is deteriorated. The perceptible resolution may be a total number of the pixels discriminated by the viewer among the pixels included in the display 1400. The maximum number of perceptible pixels may include a maximum number of horizontal perceptible pixels and a maximum number of vertical perceptible pixels, which are able to be discriminated by the viewer. Hereinafter, an example of use of Equation 1 will be described in greater detail below with reference to FIG. 3.

As illustrated in FIG. 3, the viewing distance (a distance between the viewer and the display) may, for example, be about 3 m, and the size of the display (width and height) may, for example, be about 1.23 m by about 0.73 m (1.23 m×0.73 m). In this case, the discriminant variable of the viewer may be about 0.872665 mm (=2*3000*tan(1/120)) according to Equation 1. According to the perceptible resolution, the viewer may distinguish about 1409 (=1230 mm/0.872655 mm) pixels in a horizontal direction and 837 (=730 mm/0.872655 mm) pixels in a vertical direction. In a case that the resolution of the display is a UHD (3840*2160), the maximum number of horizontal recognition pixels may be about 2.72 (=3840/1409), and the maximum number of vertical recognition pixels may be about 2.58 (2160/837). Accordingly, the viewer may recognize about 2.72 pixels as one pixel in the horizontal direction and about 2.58 pixels as one pixel in the vertical direction.

Referring to FIG. 2 again, according to an embodiment, the calculator 110 may determine a maximum natural number equal to or less than the maximum number of perceptible pixels according to Equation 1 as the number of pixels included in each pixel group. For instance, as illustrated in FIG. 3, the maximum number of horizontal perceptible pixels may be about 2.72, and the maximum number of vertical perceptible pixels may be about 2.58. In this case, the calculator 110 may determine "2" that is the maximum natural number equal to or smaller than the maximum number of perceptible pixels as the number of horizontal pixels included in each pixel group. In addition, the calculator 110 may determine "2" that is the maximum natural number equal to or less than the maximum number of perceptible pixels as the number of vertical pixels included in each pixel group. The calculator 110 may define one pixel group by a matrix of the number of horizontal pixels×the number of vertical pixels (=2*2).

According to an embodiment, the determiner 120 may divide the image displayed through the display 1400 into a plurality of pixel groups including the calculated number of horizontal pixels and the calculated number of vertical pixels. For instance, in a case that the image includes 8*8 pixels and the number of pixels included in each pixel group is 2*2, the determiner 120 may divide the 8*8 pixels of the image into 16 pixel groups each including 2*2 pixels.

According to an embodiment, the determiner 120 may determine that the pixels included in each pixel group include at least one first pixel and at least one second pixel other than the first pixel. The first pixel may be, for example, a pixel in which a first substance of a pixel value is image enhancement processed. The second pixel may be, for example, a pixel in which a second substance of a pixel value is image enhancement processed. The first substance may be an image enhancement factor different from the second substance. The term "substance" as used herein may be used interchangeably with the term "image enhancement factor" or "characteristic." The image enhancement factor may be at least one of a brightness substance, a chromatic substance, a red (R) value, a green (G) value, a blue (B) value, and a contrast value. For instance, in a case that the first substance is the brightness substance, the second substance may be the chromatic substance. Different from the above, each pixel group may further include a pixel in which a different substance from the first and second substances is image enhancement processed, but in the present disclosure, an example embodiment in which each pixel group includes only the first and second pixels will be described.

According to an embodiment, the determiner 120 may determine the number of the first and second pixels included in each pixel group based on a pixel value (e.g., brightness information) of each pixel group. For instance, the determiner 120 may calculate an average brightness value of each pixel group using the pixel value of the pixels included in each pixel group. The determiner 120 may verify in which range of a designated brightness range the calculated average brightness value belongs to determine the number of the first and second pixels included in each pixel group. The determiner 120 may determine the number of the first and second pixels such that the number of the first pixels is substantially the same or the closest to the number of the second pixels in a pixel group (e.g., a pixel group including a high or low grayscale pixel) in which the calculated average brightness value is outside a critical range. The critical range may be equal to or greater than a first critical value and less than a second critical value and correspond to a predetermined intermediate brightness range or an intermediate grayscale section. The determiner 120 may determine the number of the first and second pixels such that the number of the first pixels is less than the number of the second pixels in a pixel group in which the calculated average brightness value is within the critical range.

According to an embodiment, the determiner 120 may unify the number of the first and second pixels included in all pixel group divided from the image based on the pixel value (e.g., the brightness information) of all pixels of the image. For instance, the determiner 120 may calculate an average brightness value of all pixels of the image. The determiner 120 may determine the number of the first and second pixels with respect to all pixel groups using the calculated average brightness value. The determiner 120 may determine the number of the first and second pixels such that the number of the first pixels is substantially the same as (1:1) or similar to the number of the second pixels in each pixel group in a case that the calculated average brightness value is outside a critical range (e.g., the intermediate grayscale range). As another example, the determiner 120 may determine the number of the first and second pixels such that the number of the first pixels is less than the number of the second pixels in each pixel group in a case that the calculated average brightness value is within the critical range (e.g., the intermediate grayscale range).

According to an embodiment, the determiner 120 may determine positions of the first and second pixels in each pixel group based on the number (or a ratio of the number of the first and second pixels) of the first and second pixels included in each pixel group. In an embodiment, the determiner 120 may determine the positions of the first and second pixels in each pixel group such that the first and second pixels are positioned uniformly to a certain extent. For instance, the determiner 120 may place the first and second pixels in a uniform position in the pixel groups in which the number of the first pixels is the same as the number of the second pixels. As another example, the determiner 120 may determine the positions of the first pixel in each pixel group according to a predetermined order (a left upper end->a right lower end) in each pixel group, and then the rest of the pixels other than the first pixels in each pixel group may be determined as the second pixels.

According to an embodiment, the determiner 120 may generate type information of each pixel to correspond to the determined positions. The type information may be information indicating whether each pixel is the first pixel or the second pixel. The determiner 120 may correlate each pixel or the position of each pixel with the type information of each pixel.

According to an embodiment, the determiner 120 may determine a first substance increase rate and a second substance increase rate based on at least one of the pixel value and the number of pixels of each pixel group. The first substance increase rate may be, for example, a value (e.g., a rate) indicating how much to increase (or decrease) the first substance of the first pixel. The second substance increase rate may be, for example, a numerical value (e.g., a rate) indicating how much to increase (or decrease) the second substance of the second pixel. For instance, the determiner 120 may determine the first substance increase rate by dividing the total number of the pixels included in each pixel group by the number of the first pixels included in each pixel group. Similarly, the determiner 120 may determine the second substance increase rate by dividing the total number of the pixels included in each pixel group by the number of the second pixels included in each pixel group. As another example, each pixel group may include four pixels and one first pixel and three second pixels may be included in each pixel group. In this case, the determiner 120 may determine the first substance increase rate to 4 (=4/1) and the second substance increase rate to 4/3.

According to an embodiment, the determiner 120 may predict whether at least one pixel included in the image is saturated after the image enhancement process based on the pixel value (e.g., at least one of a brightness value and a chromatic value) of the image. For instance, in a case that a pixel group having the average brightness equal to or greater than the critical brightness among the pixel groups exists, the determiner 120 may predict that at least one pixel included in the corresponding pixel group is saturated.

According to an embodiment, the determiner 120 may control at least one of the first adjustment rate, the second adjustment rate, and the number of the first and second pixels with respect to the pixel group to be saturated after the image enhancement process or the pixel group in which the pixel to be saturated after the image enhancement process is included. For instance, the determiner 120 may decrease at least one of the first and second adjustment rates with respect to the pixel group or the pixel to be saturated such that the pixel group or the pixel is not saturated after the image enhancement process. As another example embodiment, the determiner 120 may adjust the number of the first and second pixels with respect to the pixel group, in which the pixel to be saturated after the image enhancement process is included, such that the pixel is not saturated after the image enhancement process. The first and second adjustment rates may correspond to default values set in the display device 1000 or values (e.g., brightness and color) adjusted and set by the input module 1300. The first adjustment rate may be, for example, a rate for increasing (or decreasing) the brightness value of each pixel of the image to display the image at the brightness value corresponding to the values set by the input module 1300. The second adjustment rate may be, for example, a rate for increasing (or decreasing) the chromatic value of each pixel of the image to display the image at the chromatic value corresponding to the values set by the input module 1300. As described above, the first and second adjustment rates may be adjusted and set when the pixel is predicted to be saturated after the image enhancement process.

According to an embodiment, the divider 130 may transmit each pixel included in the image to the first image processor 141 or the second image processor 142 based on the type information of each pixel. For instance, the divider 130 may transmit pixels that are identified as the first pixels based on the type information to the first image processor 141. The divider 130 may transmit pixels that are identified as the second pixels based on the type information to the second image processor 142.

In an embodiment, the divider 130 may sequentially output the pixels of the image to one of the first and second image processors 141 and 142, which corresponds to the type information of each pixel. In an embodiment, the divider 130 may further transmit substance increase rate information (e.g., the first or second substance increase rate) of each pixel when each pixel is transmitted to the first image processor 141 or the second image processor 142.

Meanwhile, according to an embodiment, the total number of the pixels included in the image may not be a multiple of the total number of the pixels included in the pixel group. In this case, a pixel (hereinafter, referred to as a "remaining pixel") that is not included in the pixel groups in the image may exist. The divider 130 may, for example, and without limitation, process the remaining pixel as follows. For example, the divider 130 may transmit the remaining pixel to the display 1400 instead of transmitting the remaining pixel to the first image processor 141 or the second image processors 142. In this case, the remaining pixel may not be image enhancement processed. The divider 130 may convert the remaining pixel having an YCbCr format to the remaining pixel having RGB format and transmit the remaining pixel to the display 1400. As another example, the divider 130 may transmit the remaining pixel to one of the first and second image processors 141 and 142. In this case, the image enhancement process is performed with respect to the first substance of the remaining pixel by the first image processor 141 or the image enhancement process is performed with respect to the second substance of the remaining pixel by the second image processor 142. As another example, the divider 130 may transmit the remaining pixel to a third image processor (not shown). In this case, the determiner 120 may determine the first substance increase rate or the second substance increase rate using an average brightness value of the remaining pixel. Then, the third image processor (not shown) may increase the first substance of the remaining pixel based on the first substance increase rate or increase the second substance of the remaining pixel based on the second substance increase rate. As another way, the third image processor may perform the image enhancement process on the remaining pixel according to the first adjustment rate and the second adjustment rate.

According to an example embodiment, the divider 130 may transmit the pixels of the image to the first image processor 141, the second image processor 142, or the display 1400 in a predetermined order. For instance, the divider 130 may transmit the pixels of the image to the first image processor 141, the second image processor 142, or the display 1400 from an uppermost left pixel to a lowermost right pixel.

According to an example embodiment, the first image processor 141 may perform the image enhancement process on the first substance (e.g., a brightness substance) of the first pixels. The first image processor 141 may perform the image enhancement process on one pixel at a time with respect to the pixels sequentially input thereto. In an example embodiment, the first image processor 141 may increase the first substance of each pixel received thereto in response to the first adjustment rate and the first substance increase rate of each pixel. As another example, the first image processor 141 may increase the first substance of each pixel received thereto by a value obtained by multiplying the first adjustment rate by the first substance increase rate. As another example, each pixel group including four pixels may include one first pixel and have the first adjustment rate set to 1. In this case, the first image processor 141 may increase the first substance of the one first pixel by four (4 (=1*4)/1) times.

According an example embodiment, the second image processor 142 may perform the image enhancement process on the second substance (e.g., a chromatic substance) of the second pixels. The second image processor 142 may perform the image enhancement on one pixel at a time with respect to the pixels sequentially input thereto. As an example, the second image processor 142 may increase the second substance of each pixel received thereto in response to the second adjustment rate and the second substance increase rate of each pixel. As another example, the second image processor 142 may increase the second substance of each pixel received thereto by a value obtained by multiplying the second adjustment rate by the second substance increase rate. As another example, each pixel group including four pixels may include three second pixels and have the second adjustment rate set to 1. In this case, the second image processor 142 may increase the second substance of the three second pixels by four-thirds (4/3 (=1*4)/3) times.

According to an example embodiment, the first and second image processors 141 and 142 may output each pixel that is image enhancement processed to the display 1400. The first and second image processors 141 and 142 may verify an output position of each pixel in the display 1400 based on the position of each pixel that is image enhancement processed. The position of each pixel may be provided from the determiner 120 or the divider 130.

According to an example embodiment, the first and second image processors 141 and 142 or other element (e.g., a converter (e.g., including converting circuitry and/or program elements)) may convert the YCbCr format of the image that is image enhancement processed to the RGB format and output the image having the RGB format to the display 1400.

According to an example embodiment, in a case that the viewer may perceive all the pixels of the display 1400, the calculator 110 and the determiner 120 may not perform a separate process on the image. In this case, the first or the second image processor 141 or 142 may output the image to the display 1400 without performing the image enhancement process on the image. The first or the second image processor 141 or 142 may output the image to the display 1400 after performing the image enhancement process corresponding to the value set through the input module 1300 on the image.

According to another example embodiment, the processor 1100 may further include the converter (not shown) to convert the RGB format of the image to the YCbCr format. For instance, the converter (not shown) may convert the RGB format of the image to the YCbCr format and transmit the image having the YCbCr format to the determiner 120.

According to another example embodiment, the processor 1100 may equalize the pixel that is image enhancement processed and output the equalized pixel to the display 1400. To this end, the processor 1100 may further include an element (not shown) that performs the equalization process.

According to another example embodiment, the processor 1100 may decrease the first substance and the second substance of the image and output the image. For instance, in a case that the display has a resolution worse than that of the image, the display device 1000 may decrease the first and second substances of the image by first and second substance decrease rates, respectively, and output the image. In this case, the determiner 120 may determine the first and second substance decrease rates using the pixel value (e.g., the brightness value) of the pixels included in each pixel group. For instance, the determiner 120 may determine a reciprocal number of each substance increase rate as the substance decrease rate.

As described above, according to various example embodiments, a distortion in image quality characteristics of images may be improved by performing the image enhancement process on the first substance or the second substance in the unit of the pixel group after grouping the image into the pixel groups, and thus the image quality of the image output through the display may be improved. In addition, according to various example embodiments, the first substance or the second substance (e.g., the first and second image enhancement factors) of each pixel of the image is distributed and processed by the image processors, and thus a time required to perform the image enhancement process may be shortened. According to various example embodiments, the image enhancement process is distributed and processed with respect to each pixel of the image, and thus an electric power required to perform the image enhancement process may be reduced.

Figure 4:
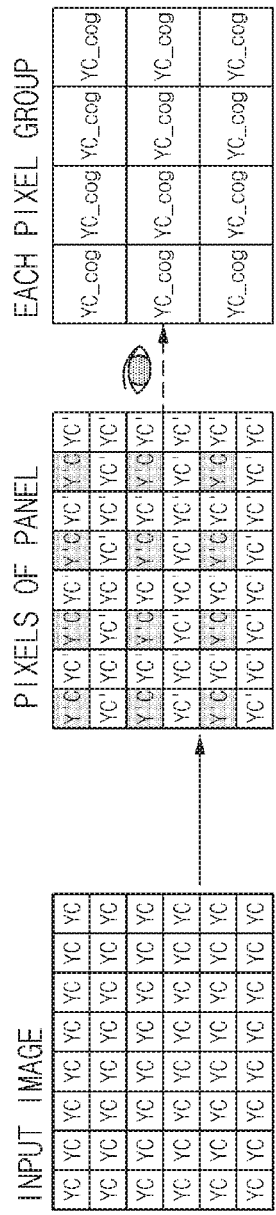
FIG. 4 is a diagram illustrating an example process of image-quality process by a processor according to an example embodiment of the present disclosure.

FIG. 4 is a diagram illustrating an example image enhancement process by a processor according to an example embodiment of the present disclosure. In FIG. 4, an image includes 6*8 pixels, each pixel group includes 2*2 pixels, and an average brightness value of the pixels included in each pixel group is within a critical range (intermediate grayscale).

Referring to FIG. 4, according to an example embodiment, the determiner 120 may determine the number of the first and second pixels with respect to each pixel group in a ratio of 1:3 in a case that the average brightness value of the pixels included in each pixel group is within the critical range.

In an embodiment, the determiner 120 may divide the image into twelve pixel groups. In an embodiment, the determiner 120 may determine a first pixel of each pixel group as the first pixel and pixels other than the first pixel as second pixels. The determiner 120 may generate type information of each of the determined pixels. For instance, the determiner 120 may generate the type information indicating the first pixel with respect to (1,1), (1,3), (1,5), (1,7), (3,1), (3,3), (3,5), (3,7), (5,1), (5,3), (5,5) and (5,7) pixels (pixels that are shaded). The determiner 120 may generate the type information indicating the second pixel with respect to pixels other than (1,1), (1,3), (1,5), (1,7), (3,1), (3,3), (3,5), (3,7), (5,1), (5,3), (5,5) and (5,7) pixels. In an example embodiment, the determiner 120 may determine the first substance increase rate to 4 (=4/1) and the second substance increase rate to 1.33 (=4/3).

According to an example embodiment, the divider 130 may sequentially output the pixel values from (1,1) pixel to (6,8) pixel one by one (from left upper end->to right lower end), verify whether each pixel is the first pixel or the second pixel based on the type information, transmit each pixel to the first image processor 141 when each pixel is the first pixel, and transmit each pixel to the second image processor 142 when each pixel is the second pixel. For instance, the divider 130 may transmit the pixel values of (1,1), (1,3), (1,5), (1,7), (3,1), (3,3), (3,5), (3,7), (5,1), (5,3), (5,5), and (5,7) pixels to the first image processor 141. The divider 130 may transmit the pixel values of the pixels other than the (1,1), (1,3), (1,5), (1,7), (3,1), (3,3), (3,5), (3,7), (5,1), (5,3), (5,5), and (5,7) pixels to the second image processor 142.

The first image processor 141 may increase the first substance of the pixel values of the (1,1), (1,3), (1,5), (1,7), (3,1), (3,3), (3,5), (3,7), (5,1), (5,3), (5,5), and (5,7) pixels depending on the first adjustment rate and the determined first substance increase rate.

The second image processor 142 may increase the second substance of the pixel values of the pixels other than the (1,1), (1,3), (1,5), (1,7), (3,1), (3,3), (3,5), (3,7), (5,1), (5,3), (5,5), and (5,7) pixels depending on the second adjustment rate and the determined second substance increase rate.

The first and second image processors 141 and 142 may output the pixel values of the pixels that are image enhancement processed to the display 1400. For example, in a case that the first and second adjustment rates are 1, the first image processor 141 may increase the brightness substance of the first pixel by four (4) times, and the second image processor 142 may increase the second substance of the second pixel by 1.33 times.

According to an example embodiment different from that of FIG. 4, in a case that the image includes 6*9 pixels, (1,9), (2,9), (3,9), (4,9), (5,9), and (6,9) pixels of the image, which are remaining pixels, may not be included in any pixel group. In this case, the remaining pixels may be output without being separately image enhancement processed.

Figure 5:
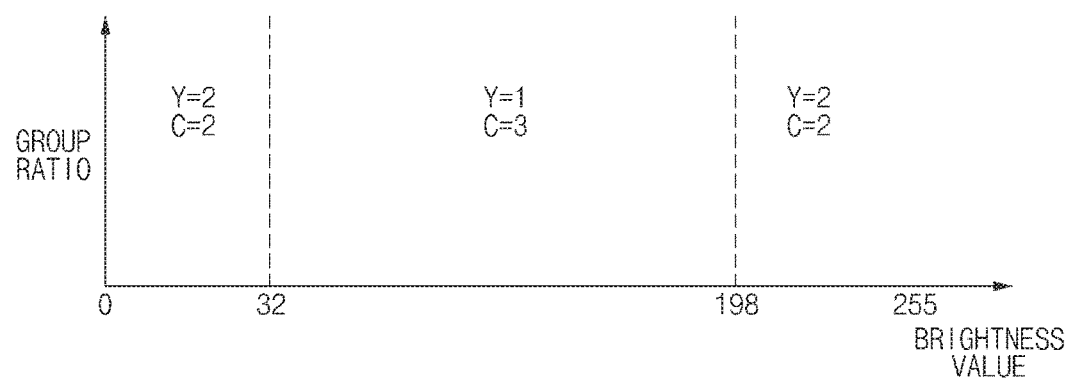
FIG. 5 is a diagram illustrating example division of a sub-group in a case that a pixel group includes 2×2 pixels according to an example embodiment of the present disclosure.

FIG. 5 is a diagram illustrating an example determination of first and second pixels with respect to a pixel group including 2×2 pixels according to an example embodiment of the present disclosure. In FIG. 5, a maximum value of the brightness value is about 255.

Referring to FIG. 5, the determiner 120 may determine the number of the first pixels and the number of the second pixels in the ratio of 1:3 with respect to the pixel group in which the average brightness of the pixels included in the pixel group is within the critical range (intermediate grayscale, $32 \leq x < 198$). For instance, the determiner 120 may determine the number of the first pixels and the number of the second pixels as 1 and 3, respectively, which are included in the pixel group in which the average brightness of the pixels is the intermediate grayscale. According to an embodiment, the determiner 120 may determine each of the number of the first pixels and the number of the second pixels in two (2) with respect to the pixel group in which the average brightness of the pixels is outside the critical range (e.g., a high grayscale or a low grayscale).

Figure 6:
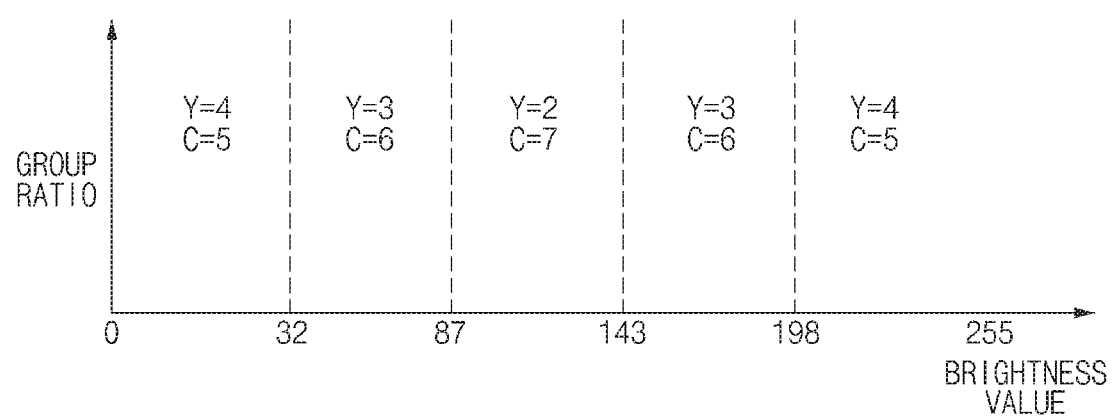
FIG. 6 is a diagram illustrating example determination of first and second pixels with respect to a pixel group including 3×3 pixels according to an example embodiment of the present disclosure.

FIG. 6 is a diagram illustrating an example determination of first and second pixels with respect to a pixel group including 3×3 pixels according to an example embodiment of the present disclosure. In FIG. 6, a maximum value of the brightness value is about 255.

Referring to FIG. 6, the determiner 120 may determine a ratio of sub-pixels in 4:5 with respect to the pixel group in which the average brightness of the pixels included in the pixel group is within a first critical range ($0 \leq x < 32$, a low grayscale) or a fifth critical range ($198 \leq x \leq 255$, a high grayscale). For instance, the determiner 120 may determine the number of the first pixels and the number of the second pixels as 4 and 5, respectively, which are included in the pixel group in which the average brightness of the pixels is within the first critical range or the fifth critical range.

The determiner 120 may determine the ratio of the sub-pixels in 3:6 with respect to the pixel group in which the average brightness of the pixels included in the pixel group is within a second critical range ($32 \leq x < 87$) or a fourth critical range ($143 \leq x \leq 198$). For instance, the determiner 120 may determine the number of the first pixels and the number of the second pixels as 3 and 6, respectively, which are included in the pixel group in which the average brightness of the pixels is within the second critical range or the fourth critical range.

The determiner 120 may determine the ratio of the sub-pixels in 2:7 with respect to the pixel group in which the average brightness of the pixels included in the pixel group is within a third critical range (87≤x<143). For instance, the determiner 120 may determine the number of the first pixels and the number of the second pixels as 2 and 7, respectively, which are included in the pixel group in which the average brightness of the pixels is within the third critical range.

FIGS. 7, 8, 9 and 10 are diagrams illustrating example first and second substance increase rates according to an example embodiment of the present disclosure.

According to an example embodiment, the processor 1100 (e.g., determiner 120) may determine a sum of the first substance increase rate applied to each pixel group based on the total number of pixels included in each pixel group. The processor 1100 may determine a sum of the second substance increase rate applied to each pixel group based on the total number of pixels included in each pixel group. For example, in a case that each pixel group includes two first pixels and two second pixels, the processor 1100 may determine the sum of each of the first and second substance increase rates as 4.

According to an embodiment, the processor 1100 may determine the first and second substance increase rates to allow the first substance increase rate to be evenly reflected to the first pixel and the second substance increase rate to be evenly reflected to the second pixel. For instance, the processor 1100 may determine the first substance increase rate by dividing the number of the pixels included in each pixel group by the number of the first pixels. The processor 1100 may determine the second substance increase rate by dividing the number of the pixels included in each pixel group by the number of the second pixels.

Figure 7:
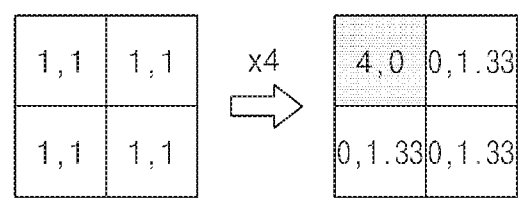
FIGS. 7, 8, 9 and 10 are diagrams illustrating example first and second substance increase rates according to an example embodiment of the present disclosure.

Referring to FIG. 7, in a case that the ratio of the sub-pixels of the pixel group is 1:3, the processor 1100 may determine the first substance increase rate as 4 (=4/1) and the second substance increase rate as 1.33 (=4/3).

Figure 8:
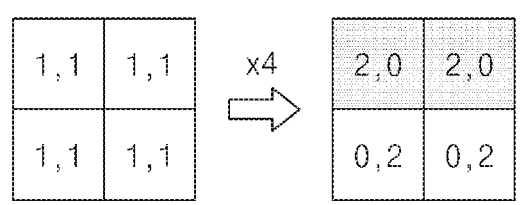

Referring to FIG. 8, in a case that the ratio of the sub-pixels of the pixel group is 2:2, the processor 1100 may determine each of the first and second substance increase rates as 2 (=4/2).

Figure 9:
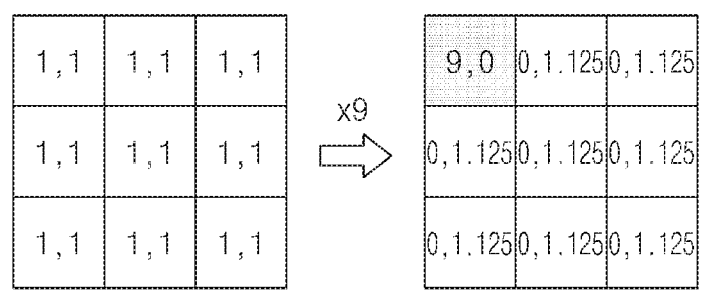

Referring to FIG. 9, in a case that the ratio of the sub-pixels of the pixel group is 1:9, the processor 1100 may determine the first substance increase rate as 9 (=9/1) and the second substance increase rate as 1.125 (=9/8).

Figure 10:
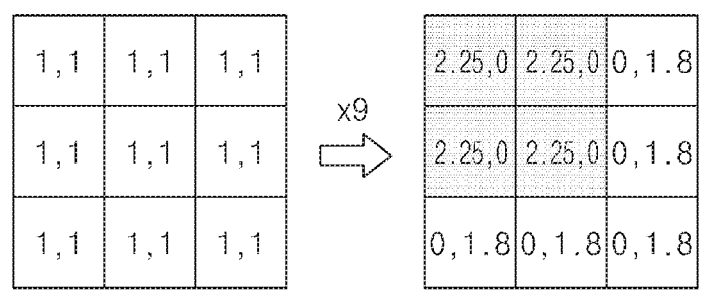

Referring to FIG. 10, in a case that the ratio of the sub-pixels of the pixel group is 4:5, the processor 1100 may determine the first substance increase rate as 2.25 (=9/4) and the second substance increase rate as 1.8 (=9/5).

Figure 11:
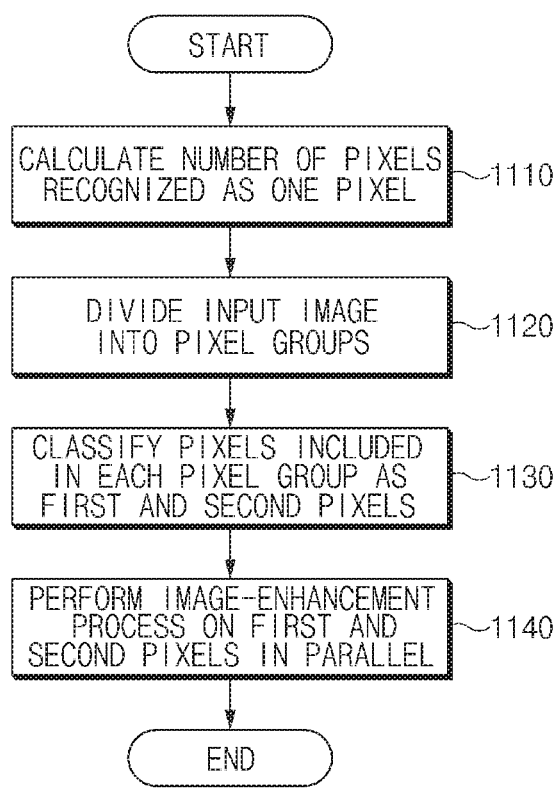
FIG. 11 is a flowchart illustrating an example method for processing an image according to an embodiment of the present disclosure.

FIG. 11 is a flowchart illustrating an example method for processing an image according to an example embodiment of the present disclosure.

Referring to FIG. 11, in operation 1100, the processor 1100 may calculate the number of horizontal pixels and the number of vertical pixels which are recognized by the viewer as one pixel. For instance, the processor 1100 may calculate the number of pixels recognized as one pixel when the viewer watches the pixels at the viewing distance. As another example, the processor 1100 may determine the number of the pixels included in the pixel group using Equation 1 described above. Since the process for calculating the number of pixels included in one pixel group by using the processor 1100 is as described above, detailed descriptions thereof will not be repeated here.

In operation 1120, the processor 1100 may divide the input image into the pixel groups each including pixels corresponding to the calculated number of the horizontal pixels and the calculated number of vertical pixels. For instance, The processor 1100 may device divide the entire pixels of the image by the calculated number of pixels in the specified order.

In operation 1130, the processor 1100 may classify the pixels included in each pixel group into the first pixel and the second pixel based on the pixel value (e.g., the brightness information) of each pixel group. For instance, the processor 1100 may verify in which brightness range the average brightness value of the pixels included in each pixel group belongs to among the predetermined brightness ranges (e.g., high, intermediate, or low grayscale) and determine the number of the first and second pixels depending on the sub-pixel ratio set with respect to the verified range. As another example, the processor 1100 may determine the number of the first and second pixels included in each pixel group using the average brightness of the total pixels of the image.

In operation 1140, the processor 1100 may perform the image enhancement process on the first substance with respect to the first pixel and the image enhancement process on the second substance with respect to the second pixel in parallel. For instance, the processor 1100 may perform the image enhancement process on the first pixel and the second pixel in parallel using two image processors. In operation 1140, the processor 1100 may perform the image enhancement process on the first and second substances of the first and second pixels to respectively correspond to the first and second substance increase rates. In operation 1140, the processor 1100 may perform the image enhancement process on each pixel by comprehensively taking into account the adjustment rate (first adjustment rate) with respect to the first substance and the adjustment rate (second adjustment rate) with respect to the second substance, which are default or adjusted set. For instance, the processor 141 may increase the first substance of the first pixel by a value obtained by multiplying the first substance increase rate by the first adjustment rate. The processor 142 may increase the second substance of the second pixel by a value obtained by multiplying the second substance increase rate by the second adjustment rate.

The processor 1100 may output the image enhancement processed pixels to the positions of the display 1400, which respectively correspond to the image enhancement processed pixel. For instance, the first and second image processors 141 and 142 may output each image enhancement processed pixel to the position of the display 1400, which respectively corresponds to the position of the received pixel in the entire image.

According to an example embodiment, the pixels may be image enhancement processed such that an interference between the pixels included in each pixel group is reduced. Thus, the distortion in image quality of the image may be improved by performing the image enhancement process on the pixels and the image quality of the image output through the display may be improved.

According to an example embodiment, the first substance or the second substance (image enhancement factor) of each pixel of the image may be selectively image-enhancement processed without separately controlling the total resolution of the image. Thus, a total operation amount for the image-enhancement process and the electric power may be reduced.

The term "module" used in this disclosure may include, for example, a unit composed of hardware, software or firmware and any combinations thereof. For example, the term "module" may be interchangeably used with the terms "logic", "logical block", "component" and "circuit". The "module" may be an integrated component or may be a minimum unit for performing one or more functions or a part thereof. The "module" may be implemented mechanically or electronically. For example, the "module" may include, for example, and without limitation at least one of a dedicated processor, a CPU, an application-specific IC (ASIC) chip, a field-programmable gate array (FPGA), and a programmable-logic device for performing some operations, which are known or will be developed.

At least a part of an apparatus (e.g., modules or functions thereof) or a method (e.g., operations) according to various embodiments may be, for example, implemented by instructions stored in a computer-readable storage media in the form of a program module. The instruction, when executed by a processor, may cause the processor to perform a function corresponding to the instruction. A computer-readable recording medium may include a hard disk, a floppy disk, a magnetic media (e.g., a magnetic tape), an optical media (e.g., a compact disc read only memory (CD-ROM) and a digital versatile disc (DVD), a magneto-optical media (e.g., a floptical disk)), and an internal memory. The instruction may include not only a mechanical code such as things generated by a compiler but also a high-level language code executable on a computer using an interpreter. A module or a program module according to various embodiments may include at least one of the above elements, or a part of the above elements may be omitted, or additional other elements may be further included.

Operations performed by a module, a program module, or other elements according to various example embodiments may be executed sequentially, in parallel, repeatedly, or in a heuristic method. In addition, some operations may be executed in different sequences or may be omitted. Alternatively, other operations may be added. While the present disclosure has been illustrated and described with reference to various example embodiments thereof, it will be understood by those skilled in the art that various changes in form and details may be made therein without departing from the spirit and scope of the present disclosure as defined by the appended claims and their equivalents.

According to various embodiments, since the image-quality process is applied to the image, the image quality of the image may be improved.

What is claimed is:

1. A display device comprising:
   a calculator comprising calculating circuitry configured to calculate a number of horizontal pixels and a number of vertical pixels, which are recognized as one pixel by a viewer;
   a determiner comprising determining circuitry configured to divide pixels of an image into a plurality of pixel groups, each pixel group being defined by the number of horizontal pixels and the number of the vertical pixels, to determine at least one pixel among the pixels included in each pixel group as a first pixel based on a pixel value of the pixels included in each pixel group, and to determine at least one pixel other than the first pixel among the pixels included in each pixel group as a second pixel;
   a first image processor configured to perform an image-enhancement process on the first pixel via a first image enhancement factor at a first increase rate; and
   a second image processor configured to perform an image-enhancement process on the second pixel via a second image enhancement factor at a second increase rate.

2. The display device of claim 1, wherein the first image enhancement factor comprises one of a chromatic factor and a brightness, and the second image enhancement factor comprises the other of the chromatic factor and the brightness.

3. The display device of claim 1, further comprising a display configured to output the pixels to which the image-enhancement process is applied by the first and second image processors, wherein the calculator is configured to determine the number of horizontal pixels and the number of vertical pixels, which are recognized as one pixel by the viewer through the display when the viewer watches the display with a viewer's eyesight at a viewing distance.

4. The display device of claim 3, wherein the calculator is configured to calculate the number of horizontal pixels and the number of vertical pixels using at least one of the viewing distance of the viewer, the viewer's eyesight, a resolution of the display, and a size of the display.

5. The display device of claim 4, wherein the calculator is configured to:
   calculate a minimum length of the display, which is identified by the viewer using the viewing distance and the viewer's eyesight;
   divide a vertical length and a horizontal length of the display by the minimum length to calculate a total number of the horizontal pixels and a total number of the vertical pixels;
   divide the number of the horizontal pixels and the number of vertical pixels based on the resolution of the display by the total number of the horizontal pixels and the total number of the vertical pixels, respectively, to calculate a maximum number of horizontal perceptible pixels and a maximum number of vertical perceptible pixels;
   calculate the number of the horizontal pixels to correspond to a natural number equal to or less than the maximum number of the horizontal perceptible pixels; and
   calculate the number of the vertical pixels to correspond to a natural number equal to or less than the maximum number of the vertical perceptible pixels.

6. The display device of claim 4, further comprising:
   an input module comprising input circuitry configured to sense or receive an input with respect to the viewer's eyesight or use a sensor to sense the viewing distance, wherein the input module is configured to sense or receive an input with respect to the viewing distance.

7. The display device of claim 1, wherein the determiner is configured to determine the pixels included in each pixel group as the first pixel and the second pixel based on an average brightness of the pixels included in the image or an average brightness of the pixels included in each pixel group.

8. The display device of claim 7, wherein the determiner is configured to:
   calculate the average brightness of the pixels included in the image or the average brightness of the pixels included in each pixel group;
   determine the number of the first pixels and the number of the second pixels such that the number of the first pixels is the same or the closest to the number of the second pixels in each pixel group when the calculated average brightness is outside a first predetermined critical range; and
   determine the number of the first pixels and the number of the second pixels such that the number of the first pixels is greater than the number of the second pixels in each pixel group when the calculated average brightness is within the first predetermined critical range.

9. The display device of claim 1, wherein the determiner is configured to:
divide a total number of the pixels included in each pixel group by a number of the first pixels included in each pixel group to determine the first image enhancement factor increase rate; and
divide the total number of the pixels included in each pixel group by a number of the second pixels included in each pixel group to determine the second image enhancement factor increase rate.

10. The display device of claim 1, further comprising:
an input module comprising input circuitry configured to receive a set value with respect to the image-enhancement process of the image; and
a memory configured to store a first adjustment rate with respect to the first image enhancement factor and a second adjustment rate with respect to the second image enhancement factor depending on the set value,
wherein the first image processor is configured to increase the first image enhancement factor of the first pixel by multiplying the first image enhancement factor increase rate by the first adjustment rate, and the second image processor is configured to increase the second image enhancement factor of the second pixel by multiplying the second image enhancement factor increase rate by the second adjustment rate.

11. The display device of claim 10, wherein the determiner is configured to:
verify whether at least one pixel included in each pixel group is predicted to be saturated after performing the image-enhancement process; and
adjust at least one of the first adjustment rate, the second adjustment rate, the number of the first pixels, or the number of the second pixels with respect to each pixel group upon the saturation being predicted.

12. The display device of claim 1, further comprising a display, wherein the first and second image processors are configured to output each pixel, to which the image-quality process is applied, to the display.

13. The display device of claim 12, wherein the determiner is configured to:
verify whether at least one pixel not grouped into the pixel groups exists in the pixels that are to be included in the image; and
transmit the at least one pixel not grouped into the pixel groups to one of the first image processor and the second image processor or to the display.

14. A method for displaying an image using at least one processor, comprising:
calculating a number of horizontal pixels and a number of vertical pixels, which are recognized as one pixel by a viewer;
dividing pixels of the image into a plurality of pixel groups, each pixel group being defined by the number of horizontal pixels and the number of the vertical pixels;
determining at least one pixel among the pixels included in each pixel group as a first pixel based on a pixel value of the pixels included in each pixel group and determining at least one pixel other than the first pixel among the pixels included in each pixel group as a second pixel; and
performing, in parallel, an image-enhancement process via a first image enhancement factor on the first pixel and an image-enhancement process via a second image enhancement factor on the second pixel.

15. The method of claim 14, wherein the first image enhancement factor comprises one of a chromatic factor and a brightness, and the second image enhancement factor comprises the other of the chromatic factor and the brightness.

16. The method of claim 14, wherein the calculating comprises determining the number of horizontal pixels and the number of vertical pixels, which are recognized as one pixel by the viewer through a display when the viewer watches the display with a viewer's eyesight at a viewing distance.

17. The method of claim 16, wherein the calculating comprises:
calculating a minimum length of the display, which is identified by the viewer using the viewing distance and the viewer's eyesight;
dividing a vertical length and a horizontal length of the display by the minimum length to calculate a total number of the pixels, which are identified by the viewer, among the pixels included in the display;
dividing a resolution of the display by the calculated total number of the pixels to calculate a maximum number of horizontal perceptible pixels and a maximum number of vertical perceptible pixels; and
calculate the number of horizontal pixels to correspond to a natural number equal to or less than the maximum number of the horizontal perceptible pixels and the number of the vertical pixels to correspond to a natural number equal to or less than the maximum number of the vertical perceptible pixels.

18. The method of claim 14, wherein the determining comprises:
calculating an average brightness of the pixels included in the image or an average brightness of the pixels included in each pixel group;
determining a number of the first pixels and a number of the second pixels such that the number of the first pixels is the same or the closest to the number of the second pixels in each pixel group when the calculated average brightness is outside a first predetermined critical range; and
determining the number of the first pixels and the number of the second pixels such that the number of the first pixels is greater than the number of the second pixels in each pixel group when the calculated average brightness is within the first predetermined critical range.

19. The method of claim 14, further comprising
verifying or receiving a first adjustment rate of the first image enhancement factor and a second adjustment rate of the second image enhancement factor with respect to the image-enhancement process of the image, wherein the performing in parallel comprises:
increasing the first image enhancement factor of the first pixel by multiplying a first image enhancement factor increase rate by the first adjustment rate; and
increasing the second image enhancement factor of the second pixel by multiplying a second image enhancement factor increase rate by the second adjustment rate.

20. The method of claim 19, wherein the determining comprises:
determining whether at least one pixel included in each pixel group is predicted to be saturated after performing the image-enhancement process; and
adjusting at least one of the first adjustment rate, the second adjustment rate, the number of the first pixels, or the number of the second pixels with respect to each pixel group upon the saturation being predicted.

* * * * *